United States Patent [19]

Nonaka

[11] 4,207,836
[45] Jun. 17, 1980

[54] VACUUM VAPOR-DEPOSITION APPARATUS

[75] Inventor: Yasuhiko Nonaka, Mobara, Japan

[73] Assignee: Hitachi, Ltd., Tokyo, Japan

[21] Appl. No.: 918,272

[22] Filed: Jun. 22, 1978

[30] Foreign Application Priority Data

Jul. 1, 1977 [JP] Japan .................................. 52-77913
Jul. 8, 1977 [JP] Japan .................................. 52-80968

[51] Int. Cl.$^2$ ............................................. B05C 11/00
[52] U.S. Cl. ..................................... 118/664; 118/697;
118/712; 118/720; 118/730
[58] Field of Search ................. 118/49.1, 50.1, 7, 8, 9,
118/664, 697, 712, 720, 730

[56] References Cited

U.S. PATENT DOCUMENTS 4,121,537  10/1978  Maruyama et al. ................ 118/49.1

*Primary Examiner*—Bernard D. Pianalto
*Attorney, Agent, or Firm*—Craig & Antonelli

[57] ABSTRACT

A vacuum vapor-deposition apparatus comprising a turntable for holding some substrates subjected to vapor-deposition, on its circumferential portions; a plurality of evaporating boats disposed opposite to the circumferential portions of the turntable; a plurality of SCR boat power sources for respectively heating the plural evaporating boats; and at least one quartz deposition monitor provided on the turntable, wherein the turntable is rotated for vacuum vapor-deposition so that the evaporated materials from the respective boats are periodically deposited on some substrates to form the start of the successively evaporated materials. This apparatus also includes a coupling device having at least a coupling coil system consisting of a primary coil rotated in synchronism with the turntable and a secondary coil so disposed as to be set concentrically with respect to the primary coil, the coupling device serving to extract an electrical signal from the quartz deposition monitor, a digital frequency counter for directly measuring the natural resonance frequency of the quartz oscilator of the deposition monitor on the basis of the noiseless signal induced in the secondary coil of the coupling system and a computor, whereby it is rendered unnecessary to set the offset frequency of the deposition monitor with the quartz oscilator.

10 Claims, 7 Drawing Figures

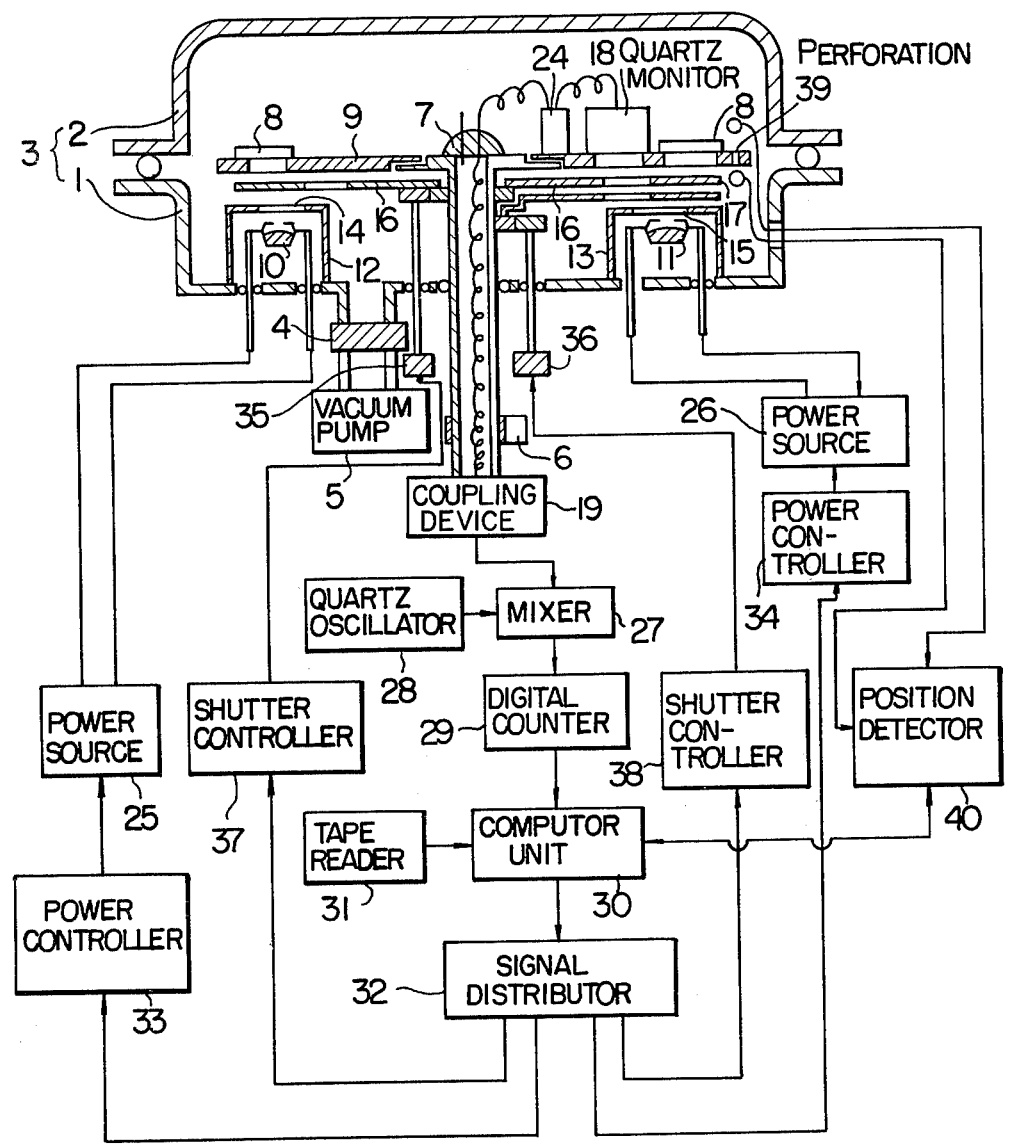
F I G. 1

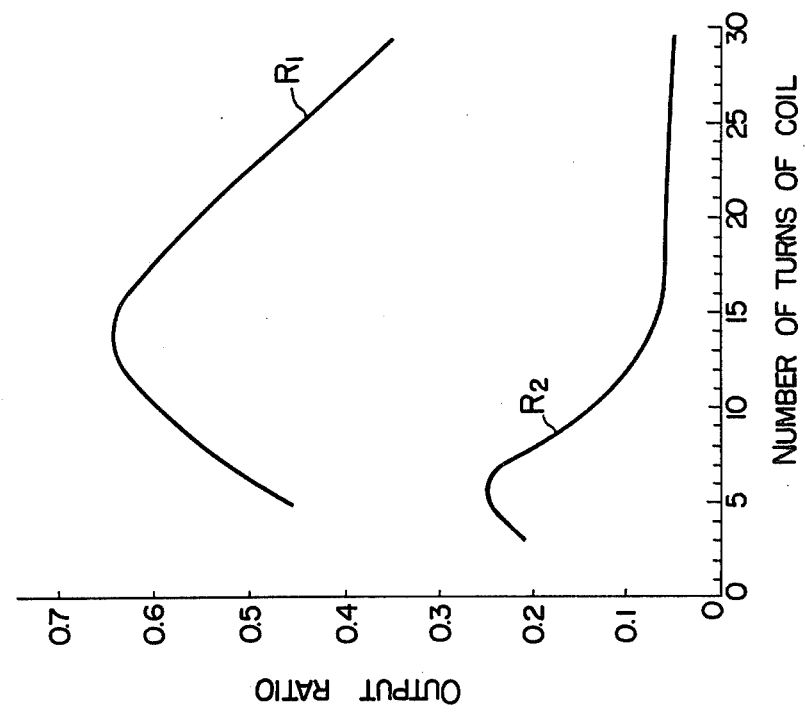
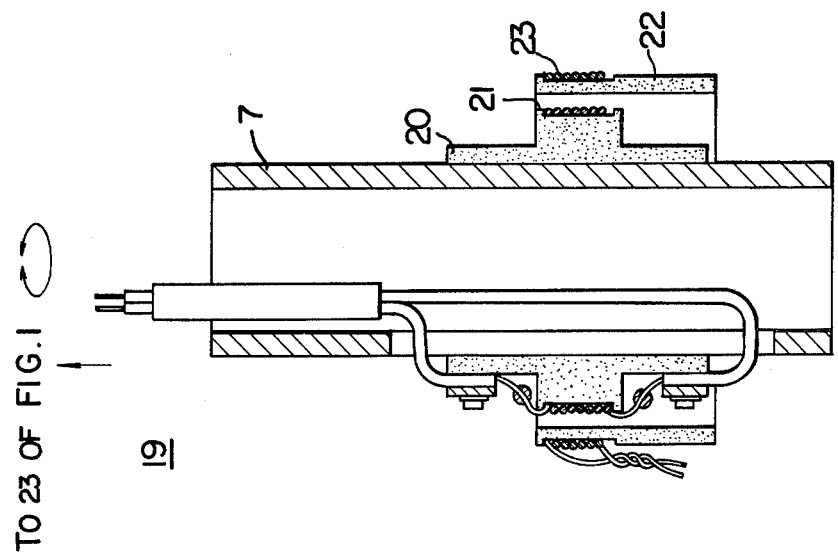

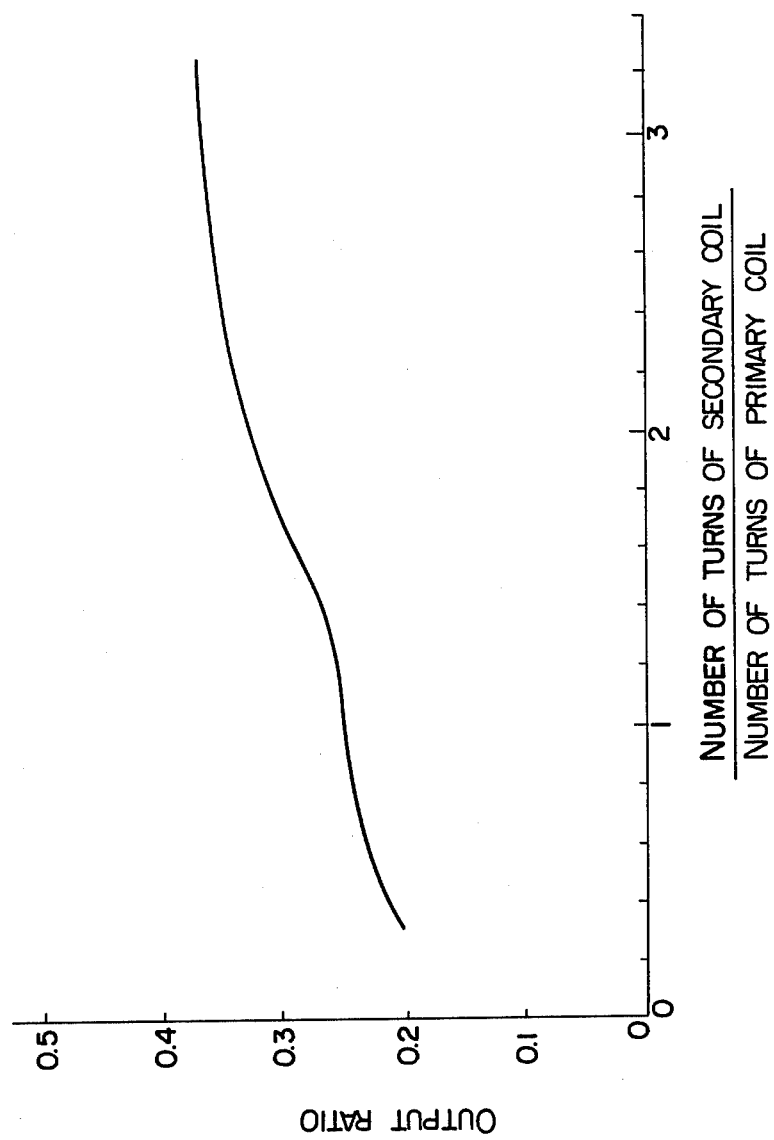

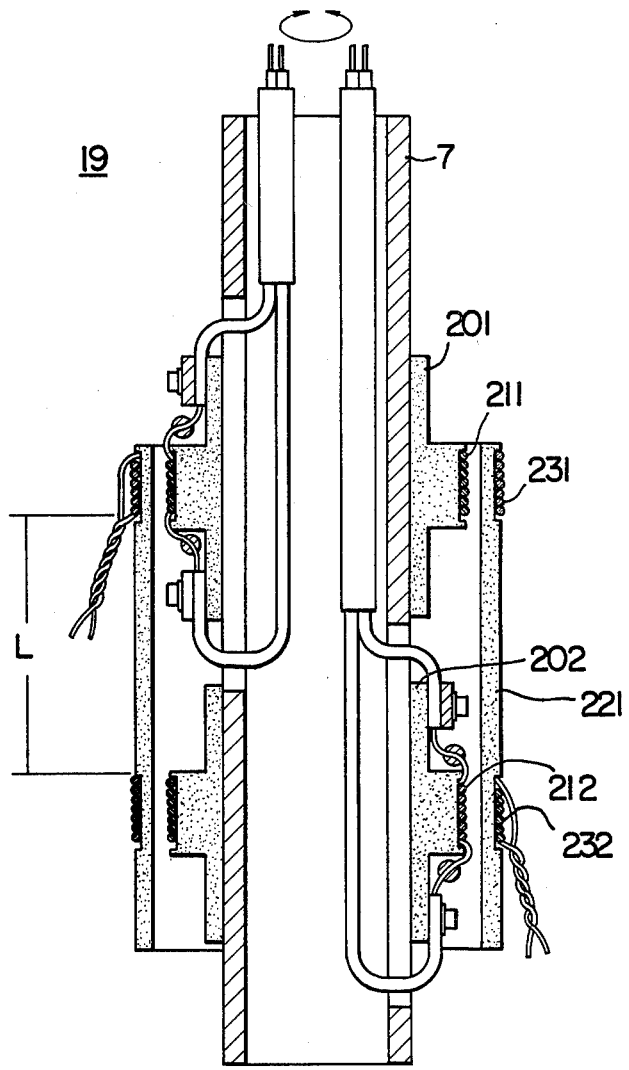

VACUUM VAPOR-DEPOSITION APPARATUS

This invention relates to a vacuum vapor-deposition apparatus for obtaining desired deposition films having predetermined component ratio, component ratio gradient and deposition quantities by controlling the evaporation of more than one element having different vapor pressures.

To form a vapor-deposited film of a compound consisting of more than one component element, the flashing vapor-deposition method or a co-evaporation method has hitherto been used which is adapted to prevent the deviation of composition from a desired one due to the different vapor pressures of the respective component elements. According to the flashing vapor-deposition method, a very small quantity of material is continuously supplied into an evaporating boat heated to high temperatures so that the total amount of the supplied material is evaporated for a short time and is deposited on a substrate. This method has an advantage that a rather uniform composition can be attained throughout the vapor-deposited film, but also has a drawback that the quality of the completed film is rather poor because of flaws in the surface of the film which are caused by the bombardment by large clusters of particles generated due to the swift evaporation of material. The co-evaporation method makes it possible to arbitrarily control the composition of a formed film, but has a drawback that the composition of a formed film varies depending upon the positions on the substrate since the distances from the respective evaporating boats to any position of the substrate are different. Moreover, in this method, the evaporating boats are disposed at a distance from each other so that vapor-deposition is possible only within a limited area. This makes the method unsuitable to large-scale production.

In order to eliminate such drawbacks as described above, a multi-source rotary vapor-deposition apparatus was filled in Japanese Patent Office as (Japanese Patent Application Laid-Open No. 103086/73) by the assignee of the present invention. According to this apparatus, which comprises a turntable for holding some substrates on its circumferential portions, a plurality of evaporating boats disposed opposite to the circumferential portions of the turntable, a plurality of boat power sources for respectively heating the evaporating boats, and quartz deposition monitors disposed above the turntable, the turntable is rotated during vapor-deposition operation, the evaporation speed of the component elements from the respective boats are successively detected by detecting the variations of the natural resonance frequencies of the quartz deposition monitors, and films can be obtained which have a desired total amount of deposition and a desired component composition in the depositing direction, i.e. the direction of film thickness, by controlling the evaporation speed of the respective elements through the feedback control based on the detected amounts of the deposited elements. This apparatus, however, has two problems: one is how to pick up the electric frequency signal and the other is how to adjust the offset frequency of the quartz deposition monitor.

First, description is given of how to pick up the signal.

Since the vapor-deposited amount, i.e. the thickness of the deposited film formed for a period by the above-mentioned multi-source rotary vapor-deposition apparatus, should be less than 50 Å, the frequency of the quartz oscillator of the deposition monitor decreases by several tens of Hz from about 6 MHz. The rotary speed must be as high as 100–300 rpm. It is therefore necessary to easily and stably take out deposition information from the vapor-deposition monitors provided above the turntable rotated at such a high speed, to supply the extracted information to a control system where the information is divided to prepare the evaporation data for the respective evaporating boats, and to control the evaporation amounts from the boats according to the evaporation data.

The brush type method and the mercury contact type method may be proposed to take out such vapor-deposition information from the rotary disc. However, these methods have the following drawbacks, as revealed by the present inventors' experiments. Namely, according to the brush type method, electric contact is sometimes broken, though only momentarily, due to the influence of high speed rotation and this will cause the instantaneous break of signals or the generation of high frequency noise so that the detection of high frequency signals of 6 MHz is disturbed. According to the mercury contact method, on the other hand, in which the rotary member is rotated at as high as 100–300 rpm, the mercury is rotated due to the friction with the rotating contact so that it takes a center-shallow, periphery-deep shape due to the centrifugal effect. Accordingly, the contact resistance becomes uneven and a frequency fluctuation within a range of several hundreds of Hz so that the pickup of signals with high reproductivity was impossible. Further, if plural quartz deposition monitors are used, the overall structure of the apparatus according to the mercury contact type method becomes very complex.

Next, the second problem, i.e. the adjustment of the offset of the resonance frequency of the quartz deposition monitor, will be described.

It is conventionally well-known to use a quartz crystal effectively as a monitor for supervising the vapor-deposited amount or the evaporated amount of material and to measure the slight variation of the oscillation frequency of a quartz monitor by comparing the frequency of an oscillator controlled on the basis of natural resonance frequency of quartz, with the frequency of a second oscillator as a reference frequency source. According to this method, however, if a quartz oscillator is used as the second oscillator, the frequency of the quartz monitor is too far from the reference frequency after several operations so that no satisfactory comparison signal can any longer be delivered. It is therefore necessary to eliminate this difficulty that the resonance frequency of the quartz monitor should be offset by providing an LC oscillator as a third reference frequency source with variable frequency.

Such an improved method of adjusting the offset of frequency is disclosed in Japanese Patent Publication No. 48423/72. The disclosed method also needs a synthesizer whose oscillation frequency is continuously variable. So the method is not adapted to generate a signal having a satisfactory precision. Further, the method employing the oscillator with continuously variable frequency cannot be free from the trouble in operation of adjusting the offset of the natural resonance frequency of the quartz monitor at the time of starting monitoring operation. Moreover, under the vapor-deposition condition of several Hz/sec the adjustment of offset is necessary also during operation.

This method has therefore a drawback that the apparatus cannot be operated continuously.

The object of this invention is to provide a vacuum vapor-deposition apparatus in which a stable signal representing the vapor-deposition information from the quartz monitor provided on the turntable rotated at high speeds can be easily taken out and in which the adjustment of the offset of the natural resonance frequency of the quartz monitor is unnecessary.

According to this invention, a coupling device having at least a coupling coil system is used, the coupling coil system consisting of a primary coil connected and therefore rotated with the turntable for taking out a frequency signal representing the evaporated quantity of material from the evaporating boat controlled by the quartz monitor fixed on the turntable for holding substrates thereon and a secondary coil so arranged as to be rotate concentrically with the primary coil, and the frequency signal induced in the secondary coil is, directly or as a beat signal obtained by mixing it with a fixed frequency, measured by a digital frequency counter and a computer so that the deposition information time-sequentially obtained is divided and reconstructed into pieces of informations to control the evaporation quantities and speeds for respective evaporating boats.

The above and other objects will become more apparent from the following description in conjunction with the accompanying drawings in which:

FIG. 1 schematically shows in cross section a vacuum vapor-deposition apparatus as an embodiment of this invention;

FIG. 2 shows in cross section an embodiment of the coupling device used in this invention;

FIGS. 3 and 4 each show the relationship between the number of turns of a coil and the output ratio, FIG. 3 being plotted with a load resistance as a parameter and FIG. 4 with a fixed primary coil;

FIG. 5 shows in cross section another embodiment of the coupling device;

Figure 6:
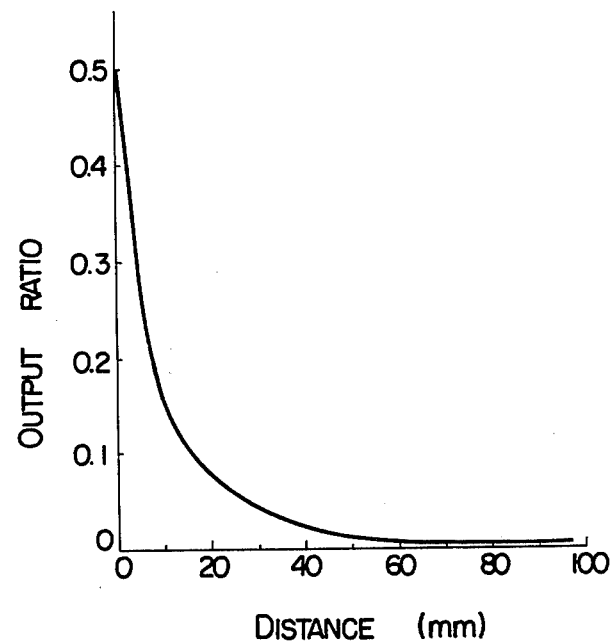
FIG. 6 shows the relationship between the intercoil distance of the coupling device and the output ratio.

FIG. 1 schematically shows the principle of a vacuum vapor-deposition apparatus according to this invention. A vacuum container 3 consisting of a base 1 and a bell jar 2 is coupled via a vacuum value 4 to a vacuum pump 5. In the vacuum container 3 is extended the end of a rotary shaft 7 rotated by a drive motor 6, and a turntable 9 for holding substrates 8 subjected to vapor-deposition on its peripheral portions is rigidly fixed to the rotary shaft 7. As the turntable 9 rotates, the substrates 8 pass over evaporating boats 10 and 11 disposed opposite to the peripheral portions of the turntable 9. So, the materials evaporated from the boats 10 and 11 are successively deposited on the substrates 8. The particles of the evaporated materials from the boats 10 and 11 are blocked except those travelling in a specific direction, i.e. collimated, by shield boxes 12 and 13 so as to prevent contamination of the container 3 by the evaporated materials. The evaporated materials flying toward the turntable 9 and therefore the deposited amount of evaporated material on the substrates 8 per unit time is controlled by adjusting the aperture of the opening defined by externally operable shutters 16 and 17.

In order to measure the amount of the deposited material on each substrate 8, a quartz monitor 18 including an oscillation circuit is provided near the substrate 8 on the turntable 9 and the monitor 18 is connected through the rotary shaft 7 and a coupling device 19 with a mixer 27 disposed outside the vacuum container 3. The quartz monitor 18 should preferably be an AT-cut quartz sheared at an angle of 35°10′, whose oscillation frequency is 6 MHz, stable and independent of variations of temperature.

The coupling device 19, attached to the end of the rotary shaft 7, comprises a coupling coil system, as shown in FIG. 2, for taking out signals from the rotary member. The coupling device 19 consists of a primary coil 21 wound about a movable bobbin 20 of bakelite (trade name) fixed to the end of the rotary shaft 7 and a secondary coil 23 wound about a stationary bobbin 22 of bakelite rigidly fixed concentrically to the movable bobbin 20. The primary coil 21 is connected through the rotary shaft 7 and an amplifier 24 with the lead conductors of the quartz monitor 18. The secondary coil 23 is connected with the mixer 27 for controlling SCR boat power sources 25 and 26.

In the case where it is desired to form a vapor-deposition film of a compound consisting of different elements A and B, the evaporating boats 10 and 11 are filled respectively with the materials A and B. The gas in the vacuum container 3 is evacuated by the vacuum pump 5, with the vacuum valve 4 open, so that vacuum of about $2 \times 10^{-6}$ torr is maintained. The turntable 9 is rotated at a speed of 100 rpm by the drive motor 6 and current is caused to flow through the evaporating boats 10 and 11 from the SCR boat power sources 25 and 26.

When the evaporation of the materials A and B start respectively from the boats 10 and 11 after the lapse of a certain time, the signal from the quartz deposition monitor 18 is sent to the primary coil 21 of the coupling element 19. The signal sent to the primary coil 21 is transferred through electromagnetic induction to the secondary coil 23. The signal induced in the secondary coil 23 is sent from the coupling device 19 to the mixer 27 (for example, "10534C mixer" sold by HEWLETT-PACKARD Co. Ltd. in U.S.A.). The signal is mixed there with the output of a quartz oscillator 28 (for example, "105A oscillator" sold by YHP (Yokogawa Hewlett Parkard Co. Ltd.) in Japan) having a fixed output frequency of 5 MHz and only the beat down signal having passed a low pass filter is measured by a digital frequency counter 29 (for example, "5345A counter" sold by YHP Co. Ltd. in Japan). The output of the digital counter 29 is subjected to arithmetic processing in a computer unit 30 (for example, "21Mx computor" sold by YHP) so as to be compared with the vapor-deposition program preset from a tape reader 31 (for example, "2748B" sold by YHP) into the computor unit 30. Namely, the resonent frequencies $f_{n-1}$, $f_n$ and $f_{n+1}$ assumed by the quartz monitor 18 before it passes and after it has passed over the evaporating boat, respectively, are memorized and the ratio of the difference between a predetermined condition $\Delta f_A$, $\Delta f_B$ and the difference between the resonance frequencies $(f_n - f_{n-1})$, $(f_{n+1} - f_n)$ to the predetermined condition $\Delta f_A$, $\Delta f_B$ is calculated:

$$R_A = \frac{\Delta f_A - (f_n - f_{n-1})}{\Delta f_A}, R_B = \frac{\Delta f_B - (f_{n+1} - f_n)}{\Delta f_B}$$

The result of the calculation is converted to control information, which is in turn sent by a signal distributor 32 (for example, "3495A scanner" sold by YHP) to power controllers 33 and 34 or shutter controllers 37 and 38. The power controllers 33 and 34 respectively include therein voltage sample hold circuits (for example, "SH725 series" sold by Hybrid Systems Corp. in USA) for respectively controlling the boat SCT power sources 25 and 26 (for example, "922 - 9179 SCR Controlled Power Supply" sold by NEVA in Japan) for heating the evaporating boats 10 and 11. The shutter controllers 37 and 38 (for example, "SH725 voltage sample hold circuit" sold by Hybrid Systems) respectively control drive apparatuses 35 and 36 such as air cylinders or dc motors for driving the shutters 16 and 17. In some cases, the information is sent simultaneously to the power controllers 33 and 34 and the shutter controllers 37 and 38 so that both the controllers may be simultaneously controlled to control the amounts of the materials A and B evaporated from the boat 10 and 11 onto the substrate 8.

Namely, if the actual deposition speed is greater than the predetermined deposition speed, the currents from the boat power sources are decreased as $R_A$ or $R_B$ increases and if the actual deposition speed is lower than the predetermined deposition speed, the currents are increased as $R_A$ or $R_B$ decreases. Further, the quantity is also controlled by opening the shutters when a predetermined evaporating speed is reached and by closing the shutters when a desired amount of deposited material is detected. If in this case the signals are taken out through the oscillator 24, the derived signals have high S/N ratio so that vapor-deposition with higher precision is possible.

Next, the results of experiments will be described wherein the numbers of turns of the primary and secondary coils 21 and 23 used in the above vacuum vapor-deposition apparatus are variously modified. In this case, the used movable and stationary bobbins 20 and 22 respectively have diameters of 48 mm and 60 mm.

FIG. 3 shows a case where the numbers of the turns of the primary and secondary coils 21 and 23 are the same and the relationship between the number of the turns and the ratio of the input signal to the primary coil to the output from the secondary coil, with the resistance of a load resistor connected with the secondary coil as a parameter, the signal having a frequency of 6 MHz. In FIG. 3, $R_1$ and $R_2$ respectively equal 1 KΩ and 100 Ω. It is seen from FIG. 3 that if the resistance increases, the output ratio increases while the undesirable induction noise also increases. It is therefore considered necessary to make the resistance lower than 100 Ω so as to avoid the induction noise. In this case, the number of the turns should be less than 10, e.g. 3–8 as an optimal condition where the output ratio is especially large.

FIG. 4 corresponds to a case where the number of the turns of the primary coil 21 is 10 and the relationship between the number of the turns of the secondary coil 23 and the ratio of the input signal to the primary coil to the output signal from the secondary coil, with number of the turns of the secondary coil 23 varied. As seen from FIG. 4, the output ratio degrades if the number of turns of the secondary coil decreases with respect to the number of the turns of the primary coil and it is necessary that the number of the turns of the primary coil should be equal to or less than the number of the turns of the secondary coil.

The above described example uses one quartz monitor and one coupling coil system. If a plurality of such monitors are used, similar coupling coil systems are used corresponding to the respective monitors.

FIG. 5 shows an embodiment of this invention wherein two coupling coil systems are used. Two movable bobbins 201 and 202 are fixed to the rotary shaft 7 and primary coils 211 and 212 are wound about the movable bobbins 201 and 202. Secondary coils 231 and 232 corresponding to the primary coils 211 and 212 are wound about the stationary bobbin 221. The primary coils 211 and 212 are connected respectively with separate quartz monitors 18 and and the secondary coils 231, 232 are connected with the mixer 27. In this case where plural coupling coil systems are used, if the distance between the coupling coil systems is small, the coil systems interfere with each other so that the precise and stable extraction of signals becomes impossible.

FIG. 6 shows the relationship between the distance L between the two coupling coil systems shown in FIG. 5 and the ratio of the input signal to the primary coil to the output signal from the secondary coil. Since the mutual interference is negligible if the distance exceeds the value for which the output ratio is less than 1/50 of its maximum value, the desirable value for L in this case is seen from FIG. 6 to be more than 45 mm. If the distance is greater than 60 mm, the output ratio falls below 1/100 of its maximum. In obtaining the above relationship shown in FIG. 6, the conditions for the experiment was the same as in the experiment to obtain the relationship in FIG. 3.

As described above, noiseless signals can be taken out by using coupling coil systems and moreover signals for stable feedback control can be obtained with a very simple constitution even though plural quartz monitors are used.

Figure 7:
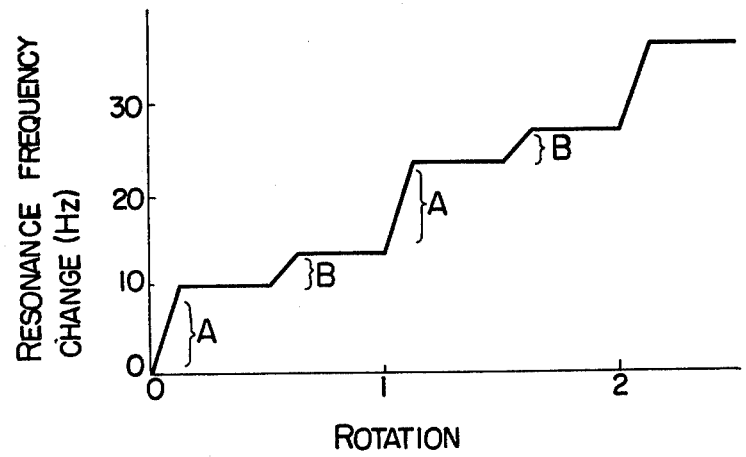
FIG. 7 shows a manner of time-sequential division in the vapor-deposition operation by a vacuum vapor-deposition apparatus according to this invention.

FIG. 7 shows the relationship between the change in the resonance frequency of the monitor 18 and the rotation of the turntable 9, i.e. the lapse of time, observed in the formation of a multi-layer vapor-deposited film by the above described rotary vapor-deposition apparatus. Now, it should be assumed that the materials A and B are evaporated simultaneously from the evaporating boats 10 and 11, respectively. Then, the change in the fundamental frequency of the quartz due to the deposition of the materials onto the quartz deposition monitor 18, while the turntable 9 is rotating at a constant speed, is as shown in FIG. 7. Namely, when the monitor 18 is passing over the evaporating boat 10, the frequency changes due to the deposition of the material A while when the monitor 18 is passing over the boat 11, the frequency changes due to the deposition of the material B. If the monitor 18 is in the position where the vertical projection thereof does not fall on the evaporating boats 10 and 11, the frequency is kept constant. Therefore, the amounts of the materials A and B evaporated from the boats 10 and 11 during a single rotation of the turntable 9 can be known by dividing such time-sequential information as derived from the quartz deposition monitor 18 by the unit 30. Further, if a perforation 39 is cut in a position in the turntable 9, a time base can be defined by the use of a position detector 40 so that the positions of the evaporating boats 10 and 11 and the positions in which the frequency is measured can be determined.

Thus, by measuring the natural resonance frequency of the quartz monitor 18 directly by a digital counter 29, the adjustment of offset of the natural resonance frequency of the monitor 18 at the beginning of and during the vapor-deposition operation, that is necessary in the prior art apparatus, can be eliminated so that the present apparatus can be operated continuously. Also, the present apparatus needs no oscillator with variable output frequency for the adjustment of offset and therefore stable signals can be obtained with high precision for a long time.

In the above embodiments, the quartz deposition monitor 18 is so disposed as to monitor always that portion of the evaporated material which is not blocked by the shutters 16 and 17, that is, as to be able to monitor the deposition condition irrespective of the opening and closure of the shutters. If the monitor 18 is located at the same position as those of the substrates 8 on the turntable 9, the deposition condition can be monitored in the same position as that of the substrate 8.

Furthermore, this invention relates in principle to a method of forming a multi-layer film, but is also applicable to a case where a film is to be formed which includes several elements having different vapor pressures in any desired component gradient ratio. In that case, the shutter 17 needs to open or close slowly after having opened the shutter 16 fast.

What I claim is:

1. In a vacuum vapor-deposition apparatus comprising
   (a) a turntable for holding on its peripheral portions substrates on which vapor-deposited film is formed;
   (b) a plurality of evaporating boats disposed opposite to said peripheral portions of said turntable;
   (c) a plurality of power sources connected respectively with said evaporating boats to heat said boats separately;
   (d) shutters located between said turntable and said evaporating boats and driven by external drive means;
   (e) at least one quartz deposition monitor with a quartz oscillator disposed on said turntable; and
   (f) a digital frequency counter, wherein materials evaporated from said boats are periodically vapor-deposited on said substrates to form multi-layer films thereon while said turntable is rotating, the improvement comprising:
   (g) a coupling device having at least one coupling coil system consisting of a primary coil connected with said quartz deposition monitor and a secondary coil, said digital frequency counter being connected with said coupling device to measure the signal induced in said secondary coil with a signal having a resonance frequency of the quartz oscillator.

2. A vacuum vapor-deposition apparatus as claimed in claim 1, wherein said primary coil is fixed to said turntable and therefore rotated together with said turntable and said secondary coil is fixed.

3. A vacuum vapor-deposition apparatus as claimed in claim 1, wherein the numbers of the turns of said primary and secondary coils are both equal to or less than 10.

4. A vacuum vapor-deposition apparatus as claimed in claim 1 or 2, wherein the number of the turns of said primary coil is not more than the number of the turns of said secondary coil.

5. A vacuum vapor-deposition apparatus as claimed in claim 1, wherein said coupling device has plural coupling coil systems and the distance between any adjacent two of them is longer than 45 mm.

6. A vacuum vapor-deposition apparatus as claimed in claim 1, further comprising, in combination, a tape reader and memory for reading in a previously prepared vapor-deposition program; a computor unit for comparing the output of said digital frequency counter with said deposition program and for calculating the result of the comparison; a position detector for detecting the angular position of said turntable so as to divide the time-sequential information derived from said quartz deposition monitor by said computor unit; power controllers for controlling said power sources for said evaporating boats; shutter controller for controlling said drive means; and a signal distributor for distributing the output information of said computor unit to said power controllers and said shutter controllers.

7. A vacuum vapor-deposition apparatus as claimed in claim 3, wherein the number of turns of said primary and secondary coils are both from 3-8.

8. A vacuum vapor-deposition apparatus as claimed in claim 2, wherein the said primary coil is wound on a movable bobbin which rotates with said turntable, and said secondary coil is wound on a stationary bobbin concentric to said movable bobbin.

9. A vacuum vapor-deposition apparatus as claimed in claim 5, wherein each of the primary coils of the plural coupling coil systems is wound on a separate movable bobbin which rotates with said turntable, and all of the secondary coils of the plural coupling coil systems are wound on a stationary bobbin concentric with the movable bobbins.

10. A vacuum vapor-deposition apparatus as claimed in claim 1, further including a mixer, connected between the at least one coupling coil system and the digital frequency counter, for mixing the frequency signal induced in the secondary coil with a fixed frequency signal.

* * * * *